United States Patent
Ku et al.

(10) Patent No.: US 7,002,192 B2
(45) Date of Patent: Feb. 21, 2006

(54) AREA EFFICIENT ASYMMETRIC CELLULAR CMOS ARRAY

(75) Inventors: Chiang-Yung Ku, Hsinchu (TW); Yu-Che Lin, Taipei (TW); Chung-Lung Pai, Taipei (TW); Pao-Chuan Lin, Lunbei Township (TW)

(73) Assignee: Richtek Technology Corp., Hsunchu (TW)

( * ) Notice: Subject to any disclaimer, the term of this patent is extended or adjusted under 35 U.S.C. 154(b) by 0 days.

(21) Appl. No.: 11/004,955

(22) Filed: Dec. 7, 2004

(65) Prior Publication Data

US 2005/0127448 A1    Jun. 16, 2005

(30) Foreign Application Priority Data

Dec. 12, 2003 (TW) .............................. 92135311 A

(51) Int. Cl.
*H01L 27/10* (2006.01)

(52) U.S. Cl. .................. 257/202; 257/204; 257/206
(58) Field of Classification Search ............... 257/202, 257/204, 206, 274, 328, 371; 438/199, 286, 438/299, 301, 302, 303, 304, 305, 275
See application file for complete search history.

(56) References Cited

U.S. PATENT DOCUMENTS

| | | | | |
|---|---|---|---|---|
| 4,532,698 A | * | 8/1985 | Fang et al. | 438/286 |
| 4,992,387 A | * | 2/1991 | Tamura | 438/174 |
| 5,170,232 A | * | 12/1992 | Narita | 257/336 |
| 2004/0124478 A1 | * | 7/2004 | Nishibe et al. | 257/406 |

* cited by examiner

*Primary Examiner*—Amir Zarabian
*Assistant Examiner*—Monica Lewis
(74) *Attorney, Agent, or Firm*—Rosenberg, Klein & Lee

(57) ABSTRACT

A cellular MOS array becomes denser by employing an asymmetric structure, in which the areas of the sources are reduced without changing the length and the width of the channel thereof, and thereby the chip size is reduced and the cost is lowered.

8 Claims, 5 Drawing Sheets

US 7,002,192 B2

AREA EFFICIENT ASYMMETRIC CELLULAR CMOS ARRAY

FIELD OF THE INVENTION

The present invention is related generally to a cellular transistor array, and more particularly, to an asymmetric cellular MOS array.

BACKGROUND OF THE INVENTION

Ever since the presence of integrated circuit (IC), the minimum channel width of the transistor in a chip has decreased with the improvement of the semiconductor process, the number of the transistors integrated in a chip has increased with stronger function and wider applications. As shown in FIG. 1, a conventional lateral cellular CMOS array 100 has a configuration of symmetric structure, in which polygon regions 102 and 108 are sources, polygon regions 104 and 106 are drains, each of them includes four contacts 112, and the sources 102 and 108 further include pick up contact 114 of the substrate. In this exemplary layout, the regions 102, 104, 106 and 108 are N+ type, poly silicon mesh 110 is used for the gates between the sources and the drains, the length and the width of the gate 110 between adjacent source/drain are L and W, respectively, and the drains 104 and 106 are lightly doped to form N type double drain (NDD) for this cellular CMOS array 100 available to be used as a high-voltage device.

Due to the rapid development of the semiconductor industry, high density and low cost are the goals each semiconductor fab chases, and it is therefore desired a denser cellular CMOS array for a wafer of the same size to be diced into more chips to lower the cost.

SUMMARY OF THE INVENTION

One object of the present invention is to provide an asymmetric cellular CMOS array.

Another object of the present invention is to provide a denser cellular CMOS array for lower cost.

In an asymmetric cellular CMOS array, according to the present invention, two drains and two sources are arranged in an array with four channels each between a pair of the source and drain, and the each of the drains has an area larger than that of each of the sources. The maximum length of the first drain in a first direction is larger than the maximum length of the first source in the first direction, and the maximum length of the first drain in a second direction is larger than the maximum length of the second source in the second direction. Likewise, the maximum length of the second drain in the first direction is larger than the maximum length of the second source in the first direction, and the maximum length of the second drain in the second direction is larger than the maximum length of the first source in the second direction. The first channel between the first drain and the first source has a width smaller than or equal to the maximum length of the first source in the first direction, the second channel between the first drain and the second source has a width smaller than or equal to the maximum length of the second source in the second direction, the third channel between the second drain and the first source has a width smaller than or equal to the maximum length of the first source in the second direction, and the fourth channel between the second drain and the second source has a width smaller than or equal to the maximum length of the second source in the first direction. Due to the asymmetric configuration of the sources and drains, the first channel and the fourth channel do not align to each other, and the second channel and the third channel do not align to each other.

By reducing the areas of the sources and rearranging the corresponding positions of the sources and drains, under the same length and width of the channels, the total area of the CMOS array is reduced more than 15%. In other words, the cellular CMOS array of the present invention decreases the chip size, such that more chips can be obtained from a wafer of the same size, resulting in lower cost.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

For a MOS to operate normally under high voltage, its drain is typically lightly doped to be an NDD to enhance the voltage endurance of the drain. Therefore, from the point of view on electric theory, the reduction of the area of the drain will result in higher electric field thereof and induces breakdown under the operation with high voltage. However, the reduction of the area of the source has no effect in this aspect, and thus, the reduction of the area of the total CMOS array can be achieved by decreasing the area of the source.

Figure 1:
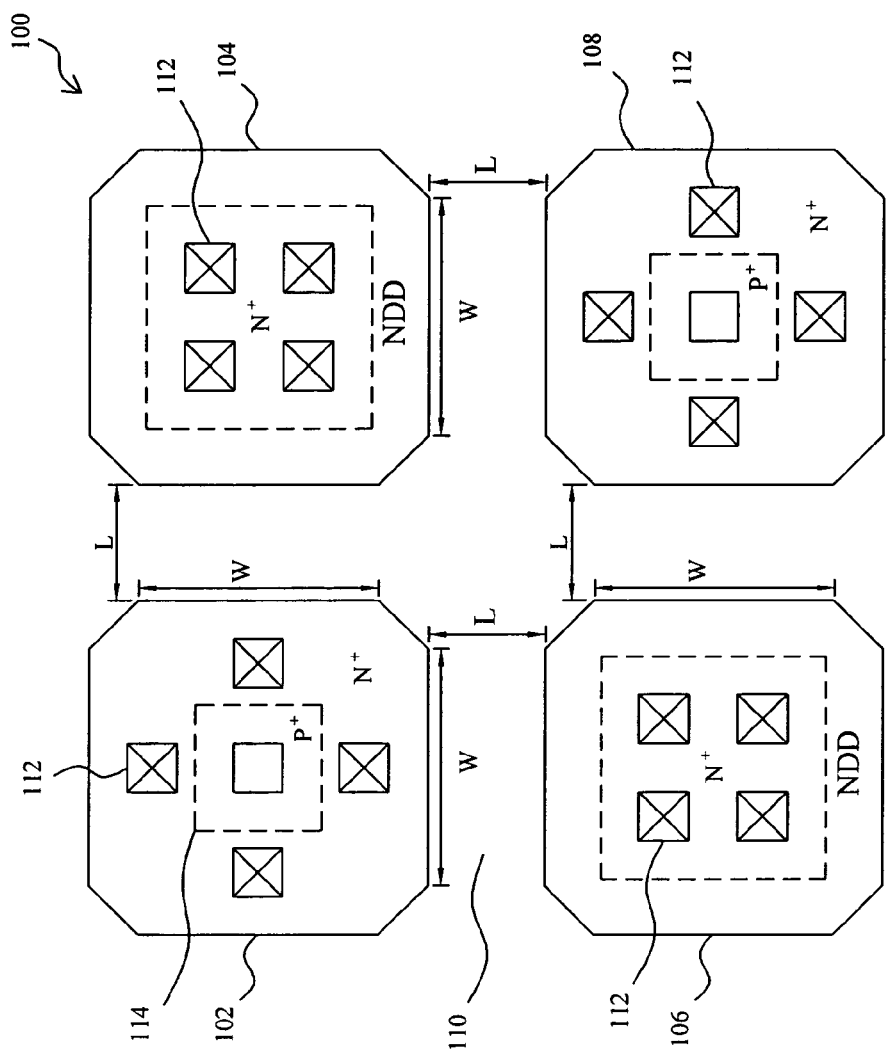
FIG. 1 shows a conventional cellular CMOS array.
Figure 2:
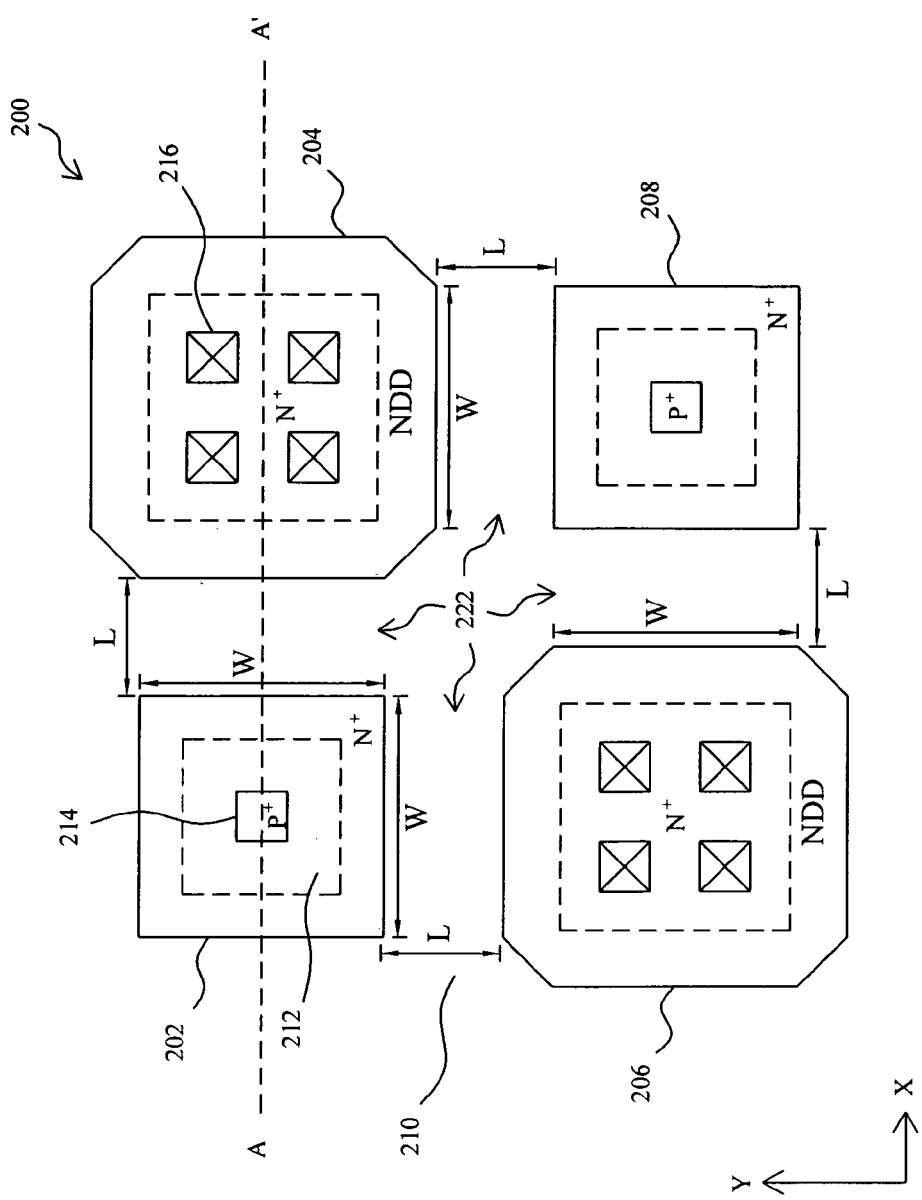
FIG. 2 shows a cellular CMOS array according to the present invention.
Figure 3:
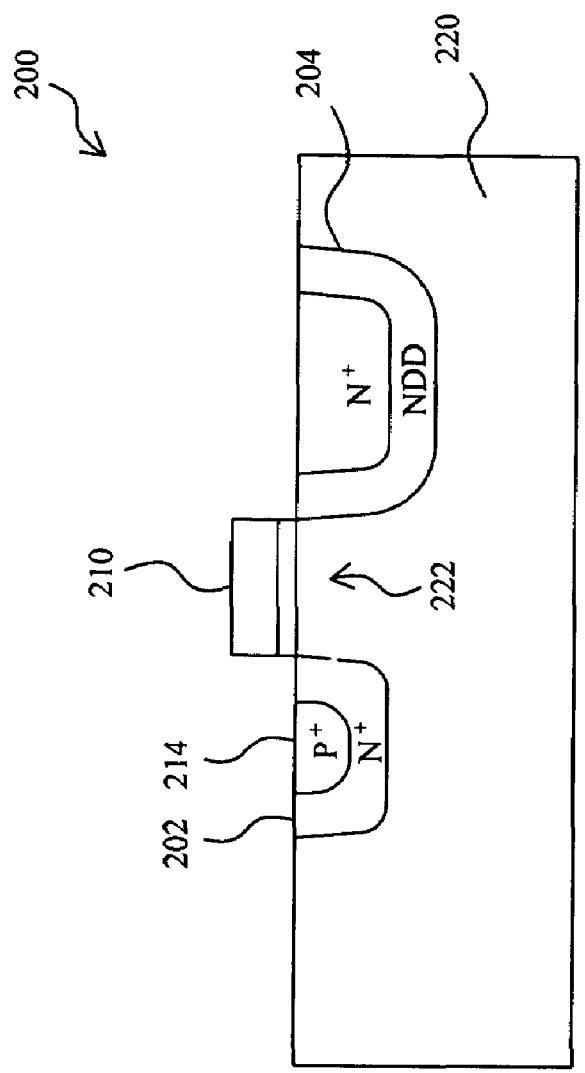
FIG. 3 shows a cross-sectional view of the cellular CMOS array along the AA' direction designated in FIG. 2.

FIG. 2 shows a layout of an asymmetric cellular CMOS array 200 according to the present invention, in which the rectangular regions 202 and 208 are sources, the polygon regions 204 and 206 are drains, each of the drains 204 and 206 has an area larger than those of the sources 202 and 208, gate 210 in a mesh shape is between the regions 202–208, and under the gate 210 the length and the width of the channel between the adjacent source/drain are L and W, respectively. Each of the source regions 202 and 208 includes contact 212 and pick up contact 214, each of the drain regions 204 and 206 includes four contacts 216, and the drain regions 204 and 206 are lightly doped to become NDDs for serving as a high voltage device. FIG. 3 shows a cross-sectional view of the cellular CMOS array 200 along the AA' direction designated in FIG. 2, in which numeral 220 designates the substrate and numeral 222 designates the channel.

Figure 4:
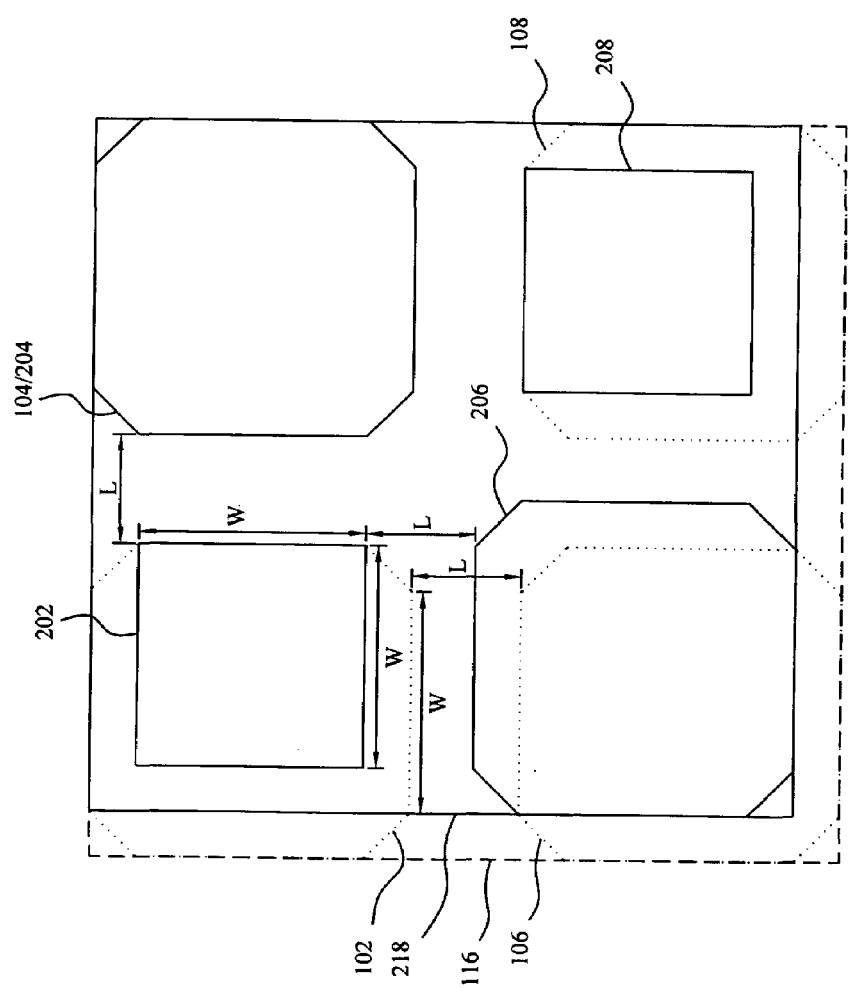
FIG. 4 shows a schematic diagram by overlaying the cellular CMOS arrays in FIG. 1 and FIG. 2.

To compare the asymmetric cellular CMOS array 200 of the present invention and the conventional symmetric cellular CMOS array 100, these two layouts are overlapped by overlapping the drain 104 of the array 100 and the drain 204 of the array 200 as shown in FIG. 4, in which the solid line indicates the array 200 and it has the area designated by region 218, and the dashed line indicates the array 100 and its area is designated by region 116. In this array 200, under the conditions that the sources area is decreased, but the lengths L and the widths W of the channels do not change, the drain 206 is moved to the upper right direction to align to the sources 202 and 208, and as a result, the total area 218 of the CMOS array 200 is smaller than that of the conventional CMOS array 100.

In the first embodiment, the maximum lengths of the sources 202 and 208 in x and y directions equal to the width W of the corresponding channels, such that the total area 218 of the CMOS array 200 is reduced more than 15%.

Figure 5:
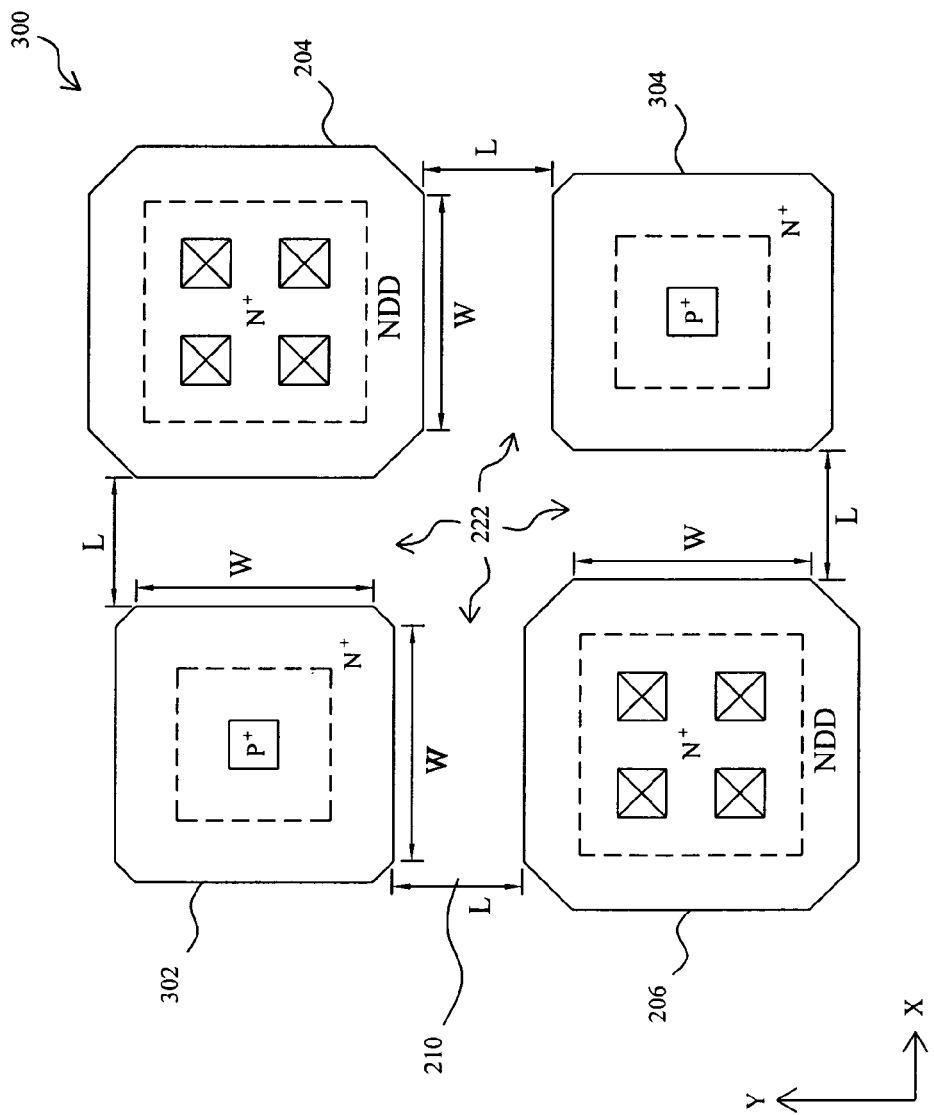
FIG. 5 shows another embodiment according to the present invention.

FIG. 5 shows another embodiment according to the present invention. In a CMOS array 300, there are polygon drain regions 204 and 206, and the source regions 302 and 304 are polygon as well, while the areas of the source regions 302 and 304 are smaller than those of the drain regions 204 and 206. The length L and the width W of the channels between each pair of the drains 204 and 206 and sources 302 and 304 do not change, while the maximum lengths of the source regions 302 and 304 in x and y directions are larger than the width W of the channel. This arrangement is also more compact than the conventional one, but it has a larger area than that of the array 200 shown in FIG. 2.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An area efficient asymmetric cellular CMOS array comprising:
   a first drain and a second drain having a first area and a second area, a first length and a second length in a first direction, and a third length and a fourth length in a second direction, respectively, and
   a first source and a second source arranged in association with the first and second drains in an array with a first to fourth channels each between one of the sources and one of the drains, the first source having a third area smaller than the first and second areas, a fifth length in the first direction smaller than the first length, and a sixth length in the second direction smaller than the third length, and the second source having a fourth area smaller than the first and second areas, a seventh length in the first direction smaller than the second length, and an eighth length in the second direction smaller than the fourth length;
   wherein the first channel between the first drain and the first source has a width smaller than or equal to the fifth length, the second channel between the first drain and the second source has a width smaller than or equal to the eighth length, the third channel between the second drain and the first source has a width smaller than or equal to the sixth length, and the fourth channel between the second drain and the second source has a width smaller than or equal to the seventh length.

2. The array of claim 1, wherein the first and second drains have a polygon region respectively.

3. The array of claim 1, wherein the first and second sources have a polygon region respectively.

4. The array of claim 1, wherein the first and second sources have a rectangular region respectively.

5. The array of claim 1, wherein the first and second areas are substantially a same value.

6. The array of claim 1, wherein the third and fourth areas are substantially a same value.

7. The array of claim 1, wherein the widths of the first to fourth channels are substantially a same value.

8. The array of claim 1, wherein the first and fourth channels do not align to each other, and the second and third channels do not align to each other.

* * * * *